United States Patent
Yin et al.

(10) Patent No.: US 9,281,398 B2
(45) Date of Patent: Mar. 8, 2016

(54) SEMICONDUCTOR STRUCTURE AND METHOD FOR MANUFACTURING THE SAME

(75) Inventors: Huaxiang Yin, Beijing (CN); Changliang Qin, Beijing (CN); Xiaolong Ma, Beijing (CN); Qiuxia Xu, Beijing (CN); Dapeng Chen, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 14/355,664

(22) PCT Filed: Jul. 3, 2012

(86) PCT No.: PCT/CN2012/000914
§ 371 (c)(1),
(2), (4) Date: May 1, 2014

(87) PCT Pub. No.: WO2013/177725
PCT Pub. Date: Dec. 5, 2013

(65) Prior Publication Data
US 2015/0179797 A1    Jun. 25, 2015

(30) Foreign Application Priority Data

May 28, 2012 (CN) .......................... 2012 1 0170314

(51) Int. Cl.
H01L 21/336 (2006.01)
H01L 29/78 (2006.01)
H01L 29/66 (2006.01)
H01L 29/10 (2006.01)

(52) U.S. Cl.
CPC ........ *H01L 29/7848* (2013.01); *H01L 29/1037* (2013.01); *H01L 29/1095* (2013.01); *H01L 29/66636* (2013.01); *H01L 29/7834* (2013.01)

(58) Field of Classification Search
CPC ..................... H01L 29/66636; H01L 29/7834; H01L 29/1037; H01L 29/1095; H01L 29/7848
See application file for complete search history.

(56) References Cited

U.S. PATENT DOCUMENTS

| | | | | |
|---|---|---|---|---|
| 2011/0291189 A1* | 12/2011 | Cheng | ............... | H01L 29/66772 257/347 |
| 2012/0001254 A1* | 1/2012 | Kronholz | ........ | H01L 21/823807 257/327 |
| 2013/0323893 A1* | 12/2013 | Chuang | ............... | H01L 27/1116 438/229 |

FOREIGN PATENT DOCUMENTS

| | | |
|---|---|---|
| CN | 1979787 | 6/2007 |
| CN | 101064286 | 10/2007 |
| CN | 102110710 | 6/2011 |

* cited by examiner

*Primary Examiner* — Thanh Y Tran
(74) *Attorney, Agent, or Firm* — Treasure IP Group, LLC

(57) ABSTRACT

The present invention discloses a semiconductor device, which comprises a substrate, a gate stack structure on the substrate, a channel region in the substrate under the gate stack structure, and source and drain regions at both sides of the channel region, wherein there is a stressed layer under and at both sides of the channel region, in which the source and drain regions are formed. According to the semiconductor device and the method for manufacturing the same of the present invention, a stressed layer is formed at both sides of and under the channel region made of a silicon-based material so as to act on the channel region, thereby effectively increasing the carrier mobility of the channel region and improving the device performance.

8 Claims, 4 Drawing Sheets

SEMICONDUCTOR STRUCTURE AND METHOD FOR MANUFACTURING THE SAME

CROSS REFERENCE

This application is a National Phase application of, and claims priority to, PCT Application No. PCT/CN2012/000914, filed on Jul. 3, 2012, entitled 'Semiconductor Device and Method For Manufacturing The Same', which claimed priority to Chinese Application No. CN 201210170314.7, filed on May 28, 2012. Both the PCT Application and Chinese Application are incorporated herein by reference in their entireties.

FIELD OF THE INVENTION

The present invention relates to a semiconductor device and a method for manufacturing the same, and particularly to a MOSFET having a fully strained channel and a method for manufacturing the same.

BACKGROUND OF THE INVENTION

From the 90 nm CMOS integrated circuit technique, Strain Channel Engineering for the purpose of increasing the channel carrier mobility plays an increasingly important role with continuous reduction in the device feature size. Various strain techniques and new materials have been integrated into the device process, namely, a compressive stress or a tensile stress is introduced in the channel direction so as to increase the carrier mobility and improve device performance.

For example, for 90 nm process node, compressive stress in a PMOS device is provided by using embedded SiGe (e-SiGe) source/drain or using a (100) crystal orientation substrate in combination with a tensile stress contact etch stop layer (tCESL); for 65 nm process node, the first generation source/drain stress memorization technique ($SMT^{\times 1}$) is further adopted on the basis of the 90 nm process node, for example, a dual contact etch stop layer is used; for 45 nm process node, the second generation source/drain stress memorization technique ($SMT^{\times 2}$) is used on the basis of the previous technique, for example, e-SiGe technique may be used in combination with a tCESL or a dual CESL, besides, Stress Proximity Technique (SPT) may be used, moreover, a (110)-plane substrate is adopted for PMOS and a (100)-plane substrate is adopted for NMOS; after 32 nm process node, the third generation source/drain stress memorization technique ($SMT^{\times 3}$) is used, for example, embedded SiC source/drain is used on the basis of the previous techniques to enhance the tensile stress in a NMOS device.

In addition, in order to increase the carrier mobility of the channel region, various non-silicon based materials can be used, for example, Ge, GaAs, InP, GaSb, InAs, InSb whose (electron) mobility progressively increase.

Moreover, technology of introducing stress to a channel can be realized by controlling a material or a cross-section shape of the channel or the spacer apart from changing the materials of the substrate or the source/drain. One example is that a dual stress liner (DSL) technique can be adopted. Another example is that a tensile stressed $SiN_x$ layer spacer can be adopted for a NMOS and a compressive stressed spacer can be adopted for a PMOS. Still another example is that the cross-section of the embedded SiGe source/drain is manufactured as a Σ-shape so as to improve the channel stress of the PMOS.

Generally speaking, the above-mentioned various channel strain techniques that have already been widely used can basically be divided into two categories, i.e. (biaxial) global substrate strain and uniaxial process induced channel strain. The biaxial global strain technique requires to change the substrate material, so it involves problems concerning material growth defects (e.g. energy level change, state density change, carrier concentration change, etc. caused by the change in substrate material), problems concerning compatibility with the CMOS device technique, problems concerning the interface state of the interface between the substrate and the ultra-thin high-K oxide layer, and the like. In contrast, the uniaxial local strain technique uses a process-induced strain and does not require to change the substrate, so the channel strain can be selected effectively without incurring problems concerning such as material growth defects and CMOS process compatibility, and there is a good interface between the substrate and the ultra-thin high-K oxide layer. As a result, the uniaxial local strain technique gradually becomes the mainstream technique.

In spite of the above-mentioned defects, the biaxial global strain technique can increase the carrier mobility to a great extent effectively due to its ability to provide good strain in two axial directions. If the biaxial process can be improved to overcome the above-mentioned defects and realize good fully strained channel, and to overcome the defects in the existing techniques while making full use of the advantages of the biaxial process, it will help to further improve the device performance and reduce the cost.

SUMMARY OF THE INVENTION

In view of the above, the present invention aims at providing a novel MOSFET having a fully strained channel and a method for manufacturing the same.

To this end, the present invention provides a semiconductor device, which comprises a substrate, a gate stack structure on the substrate, a channel region in the substrate under the gate stack structure, and source and drain regions at both sides of the channel region, characterized in that there is a stressed layer under and at both sides of the channel region, in which the source and drain regions are formed.

In one embodiment of the present invention, the stressed layer has a Σ-shaped or inverse trapezoidal cross-section.

In another embodiment of the present invention, the semiconductor device further comprises a silicide layer formed on top of the source and drain regions.

In another embodiment of the present invention, the semiconductor device further comprises a silicon-containing cap layer formed on top of the source and drain regions and a silicide layer formed on the silicon-containing cap layer.

In another embodiment of the present invention, the source and drain regions include source and drain extension regions and heavily doped source and drain regions.

In still another embodiment of the present invention, for a PMOS, the material of the stressed layer includes one of SiGe, SiSn and GeSn, or combinations thereof; and for a NMOS, the material of the stressed layer includes one of Si:C, Si:H and SiGe:C, or combinations thereof.

The present invention also provides a method for manufacturing a semiconductor device, which comprises: forming a gate stack structure on a substrate; etching the substrate at both sides of the gate stack structure to form source/drain grooves, wherein a part of the substrate between the source/drain grooves and the gate stack structure forms a channel region; epitaxially growing a stressed layer in the source/ drain grooves, wherein, the stressed layer is located under and at both sides of the channel region; forming source and drain regions in the stressed layer.

In one embodiment of the present invention, the source/drain grooves have Σ-shaped or inverse trapezoidal cross-sections.

In another embodiment of the present invention, the step of forming the source/drain grooves further includes: etching the substrate to form first grooves whose top and bottom are substantially of the same width; etching the sidewall of the first grooves to form second grooves. Wherein the second grooves are communicated.

In another embodiment of the present invention, the method further comprises performing an in-situ doping to the upper part of the stressed layer to form the source and drain regions at the same time of epitaxially growing the stressed layer.

In another embodiment of the present invention, a doped ion implantation is performed to the stressed layer to form the source and drain regions.

In another embodiment of the present invention, after forming the source and drain regions, a silicide layer is formed on top of the source and drain regions.

In another embodiment of the present invention, after forming the source and drain regions, a silicon-containing cap layer is formed on top of the source and drain regions, then a silicide layer is formed on the silicon-containing cap layer.

In still another embodiment of the present invention, for a PMOS, the material of the stressed layer includes one of SiGe, SiSn and GeSn, or combinations thereof; and for a NMOS, the material of the stressed layer includes one of Si:C, Si:H and SiGe:C, or combinations thereof.

According to the semiconductor device and a method for manufacturing the same of the present invention, a stressed layer is formed under and at both sides of the channel region made of a silicon-based material so as to act on the channel region, thereby effectively increasing the carrier mobility of the channel region and improving the device performance.

BRIEF DESCRIPTION OF THE DRAWINGS

The technical solution of the present invention will be described in detail with reference to the drawings below, wherein.

DETAILED DESCRIPTION OF THE PREFERRED EMBODIMENTS

The features and technical effects of the technical solution of the present invention will be described in detail below with reference to the figures and in conjunction with exemplary embodiments. Disclosed are a novel MOSFET having a fully strained channel and a method for manufacturing the same. It shall be noted that like reference signs denote like structures, and such terms as "first", "second", "above" and "under" can be used to modify various device structures or manufacturing processes. Except for specific explanations, such modification does not imply the spatial, sequential or hierarchical relation of the device structures or manufacturing processes.

Figure 1A:
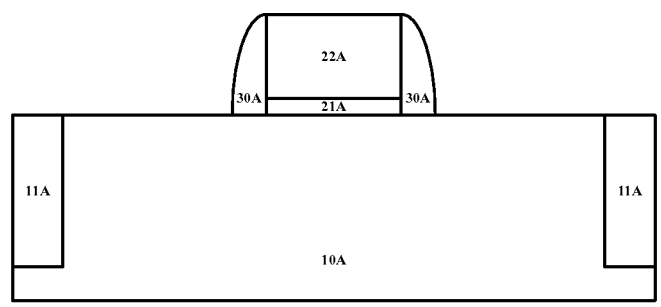
FIGS. 1-6 are sectional views of the steps of the method for manufacturing the MOSFET according to one embodiment of the present invention.
Figure 1B:
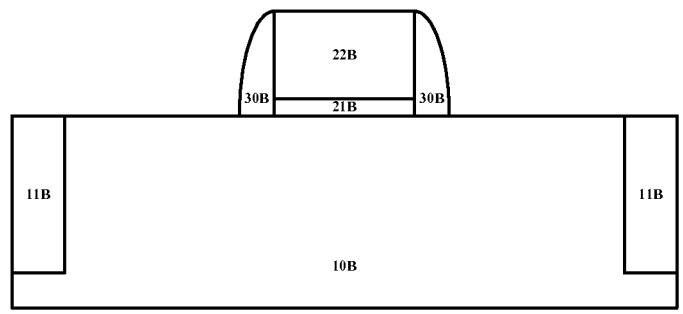

Referring to FIGS. 1A and 1B, a gate (or dummy gate) stack structure 20 is formed on a substrate 10. Wherein, only for the purpose of illustration, FIG. 1A is a sectional view of an MOSFET (e.g. PMOS) of a first conduction type, and FIG. 1B is a sectional view of an MOSFET (e.g. NMOS) of a second conduction type, and similarly in the text blow, any figure named by a letter A represents, for example, the PMOS, and any figure named by a letter B represents, for example, the NMOS. Needless to say, the two types of MOSFET may have their locations, layout, structures and materials exchanged according to the need of the specific CMOS layout design, so the specific limitations about one type of MOSFET in the following texts can actually be modified to be adapted to all other types of MOSFET in the present application.

A substrate 10 (including 10A, 10B) is provided, which is selected reasonably according to the need of the use of the device and can include one of monocrystalline bulk silicon (Si), Silicon On Insulator (SOI), monocrystalline germanium (Ge), Germanium on Insulator (GeOI), strained Si, germanium-silicon (SiGe), a compound semiconductor material like gallium nitride (GaN), gallium arsenide (GaAs), indium phosphide (InP), indium antimonide (InSb), and a carbon-based semicondcutor such as graphene, SiC and carbon nanotube. In order to be compatible with the CMOS process, the substrate 10 is preferably bulk Si or SOI. Particularly, the material of a substrate 10A of a first MOSFET may be the same as or different from the material of a substrate 10B of a second MOSFET, and similarly, A and B in each of the structures or material layers may be the same or different in the following descriptions. A shallow trench isolation (STI) 11 (including 11A, 11B) is formed in the substrate 10, wherein, for example, the substrate 10 is photoetched/etched first to form a shallow trench, then an insulating isolation material is deposited using conventional techniques like LPCVD and PECVD and is planarized by means of chemical mechanical polishing (CMP) until the substrate 10 is exposed, thus the STI 11 is formed, wherein the STI 11 may be filled by such materials as oxides, nitrides and oxynitrides.

A gate insulating layer 21 (including 21A, 21B) and a gate material layer 22 (including 22A, 22B) are deposited in sequence on the surface of the entire wafer, i.e. the surfaces of the substrate 10 and the STI 11, and are etched to form a gate stack structure 20 (21/22). For the gate-last process, the gate stack structure is a dummy gate stack structure, which will be removed in the subsequent process, in such case the gate insulating layer 21 is preferably a pad layer made of silicon oxide, and the dummy gate layer 22 is preferably one of polysilicon, amorphous silicon, microcrystalline silicon and even silicon oxide. For the gate-first process, the gate stack structure will be retained in the subsequent process, in such case the gate insulating layer 21 is preferably made of one of silicon oxide, nitrogen-doped silicon oxide, silicon nitride and other high-K materials including, but not limited to, one of hafnium-based materials such as $HfO_2$,$HfSiO_x$,HfSiON, $HfAlO_x$,$HfTaO_x$,$HfLaO_x$,$HfAlSiO_x$, $HfLaSiO_x$ (wherein the content x of the oxygen atom can be adjusted appropriately in each of the materials according to the different proportions and chemical valences of the multiple metal components, for example, it may be 1~6 and not limited to integer), a rare earth based high-K dielectric material selected from a group consisting of $ZrO_2$,$La_2O_3$,$LaAlO_3$,$TiO_2$ and $Y_2O_3$, and $Al_2O_3$, or a composite layer thereof. The gate material 22 can be one of polysilicon, polycrystalline germanium-silicon and metal, wherein the metal may include a metal element such as Co, Ni, Cu, Al, Pd, Pt, Ru, Re, Mo, Ta, Ti, Hf, Zr, W, Ir, Eu, Nd, Er and La, alloys of the metals or nitrides of the metals, and wherein such elements as C, F, N, O, B, P and As can be doped to adjust the work function. A barrier layer made of nitride (not shown) is preferably formed between the gate (conductive) material layer 22 and the gate insulating layer 21 by means of conventional methods like PVD, CVD and ALD, and the material of the barrier layer is one of $M_xN_y$, $M_xSi_yN_z$, $M_xAl_yN_z$ and $M_aAl_xSi_yN_z$, wherein, M is one of Ta, Ti, Hf, Zr, Mo, W and other elements. More preferably, the gate conductive layer 22 and the barrier layer can not only be formed as a superposed composite layer structure, but also be formed as a mixed injection doping layer structure, namely, the materials forming the gate conductive layer 22 and the barrier layer are deposited simultaneously on the gate insulating layer 21, so the gate conductive layer includes the material of the barrier layer.

A gate spacer made of such material as silicon nitride, silicon oxynitride or diamond-like carbon (DLC) is deposited on the entire device, and is etched to form a gate spacer 30 (including 30A, 30B).

Figure 2A:
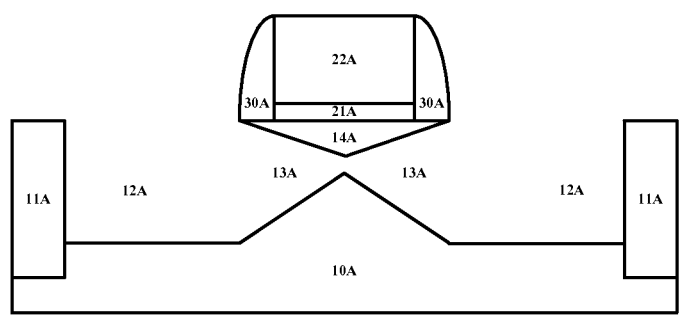
Figure 2B:
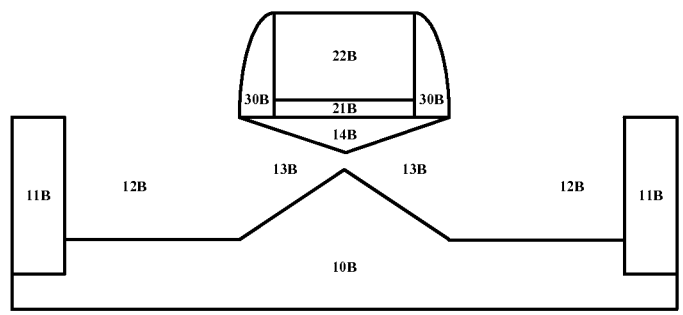

Afterwards, referring to FIGS. 2A and 2B, the substrate 10 at both sides is etched using the gate stack structure 20 and the gate spacer 30 as a mask to form source/drain grooves 12/13 having Σ-shaped or inverse trapezoidal cross-sections. First, first grooves 12 (including 12A, 12B) are formed in the substrate 10 at both sides of the gate stack structure 20/gate spacer 30 by means of dry etching, such as fluoro-, chloro-, oxy- (reactive) plasma etching. The first grooves 12 have sidewalls that are substantially or completely vertical, that is, the top and bottom widths thereof are substantially or completely equal. Preferably, the depth of the first grooves 12 is smaller than the thickness of the STI 11 so as to realize good insulation. Then, the sidewalls of the first grooves 12 are laterally etched by means of wet etching, such as using etching liquids like TMAH, so as to form second grooves 13 (including 13A, 13B). Since one side of each first groove 12 is in contact with the STI 11 made of an oxide material, and the other side thereof is in contact with the substrate made of a silicon material located under the gate stack structure, etching liquids like TMAH selectively etch the substrate 10 under the gate stack structure laterally while leaving the STI 11 substantially un-etched during the wet etching, thus forming the second grooves 13 located at a side of each first groove 12 and under the gate stack structure. The first grooves 12 and the second grooves 13 together form source/drain grooves having Σ-shaped or inverse trapezoidal cross-sections, wherein the cross-sections are taken along a direction perpendicular to the substrate surface and parallel to the channel region. The so-called Σ-shaped or inverse trapezoidal cross-section means to indicate that the width of the middle of the grooves is greater than the width of the top and/or bottom of the grooves. Preferably, appropriate etching process parameters are selected, so that the parts of the second grooves 13 that extend under the gate stack structure have a width greater than or equal to half of the width of the gate stack structure, in this case, the second grooves 13 at both sides can be connected or communicated, thus a part of the substrate 10 made of a silicon material under the gate stack structure 20 is retained as the future channel region 14 (including 14A, 14B). It shall be noted that although FIGS. 2A and 2B show that the source/drain grooves 12/13 are located under and obliquely under the channel region 14, i.e. the channel region 14 is suspended under the gate stack structure 20, the channel region 14 is still connected to the rest parts of the substrate 10 and is thus supported in regions outside of the range of the source/drain grooves 12/13, because the widths of the source/drain grooves 12/13 are smaller or equal to the width of the gate stack structure 20 (depending on the rule of the layout) in a direction vertical to the paper, i.e. vertical to the channel region (especially from a top view which is not shown).

Figure 3A:
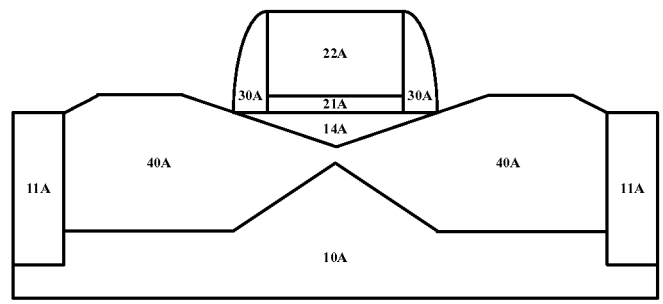
Figure 3B:
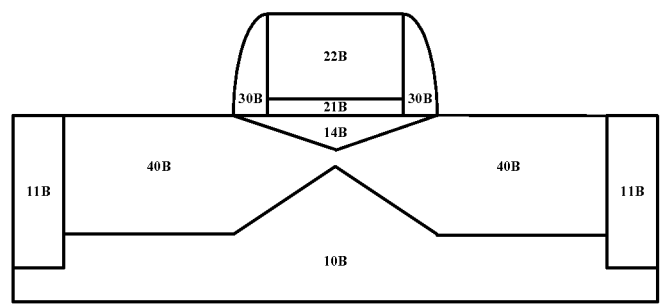

Referring to FIGS. 3A and 3B, a stressed layer is epitaxially grown in the source/drain grooves. An embedded stressed layer 40 (40A, 40B) are epitaxially grown in the source/drain grooves 12/13 having Σ-shaped or inverse trapezoidal cross-sections by means of such epitaxial growth technologies as MOCVD, ALD and MBE. For different types of MOSFETs, the materials for the stressed layer may be different. For example, for a first MOSFET (PMOS) at the left side, the stressed layer 40A may be one of SiGe, SiSn and GeSn, or combinations thereof so as to apply a compressive stress to the channel region 14A to increase the cavity mobility; and for a second MOSFET (NMOS) at the right side, the stressed layer 40B may be one of Si:C, Si:H and SiGe:C, or combinations thereof Wherein, as shown in FIG. 3A, the top of the stressed layer 40A is higher than the top of the STI 11A (the growth rate is lower at the edge than at the center during the epitaxial growth, so the top is higher and the edge is lower). In contrast, as shown in FIG. 3B, the top of the stressed layer 40B is flush with the top of the STI 11B (preferably, a planarization processing may be performed by CMP after completion of the epitaxial growth). Such a configuration is only exemplary, while the height difference between the tops can be set discretionarily.

Preferably, when forming the stressed layer 40 by epitaxial growth, an in-situ doping can be performed so as to adjust the conduction type of the stressed layer 40 according to the type of the MOSFET. For example, phosphor (P,) arsenic (As), stibium (Sb) and the like are doped for the NMOS, while boron (B), aluminum (Al), gallium (Ga), indium (In) and the like are doped for the NMOS. In addition, when performing the in-situ doping during the epitaxial growth, the time point at which the dopant is added can be controlled so that the doping concentration for a portion of the stressed layer 40 near the bottom of the substrate 10 is lower than the doping concentration for a portion of the stressed layer 40 near the top of the substrate 10. As an example, no in-situ doping is performed at the bottom of the stressed layer 40 but only a stress is applied thereto, and an in-situ doping is performed on the top of the stressed layer 40 to form source and drain regions.

Figure 4A:
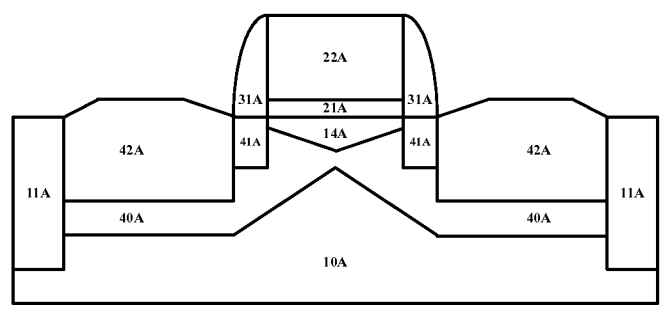
Figure 4B:
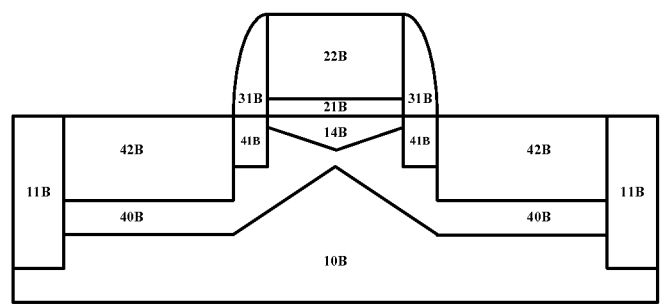

Further, in order to better adjust the conduction characteristics of the source and drain regions of the device, referring to FIGS. 4A and 4B, source and drain extension regions 41 (including 41A, 41B) and source and drain regions 42 (including 42A, 42B) are formed in the stressed layer 40.

For the gate-last process, the gate spacer 30 is removed first by etching, then a first source/drain ion implantation is performed using the dummy gate stack structure 20 as a mask, and a doping is performed to form lightly doped source and drain extension regions 41A/41B (or LDD regions), wherein, the dopant type and category are similar to the above-mentioned in-situ doping and set according to the need of the MOSFET conduction type, so this will not be elaborated anymore. Subsequently, a gate spacer 31A/31B made of nitrides or oxynitrides are formed by depositing and etching again. A second source/drain ion implantation is performed using the gate spacer 31 as a mask to form heavily doped source and drain regions 42A/42B, wherein the source and drain regions 42 is of the same conduction type as the source and drain extension regions 41, except that the source and drain regions 42 have higher dopant concentration and larger junction depth. Then the doped ions are activated by annealing.

For the gate-first process, the gate spacer is not removed, but the source and drain extension regions 41 are formed under the gate spacer 30 by means of an angled ion implantation process, then a vertical ion implantation is performed by using the gate spacer as a mask so as to form source and drain regions 42. Likewise, the doped ions are activated by annealing.

Figure 5A:
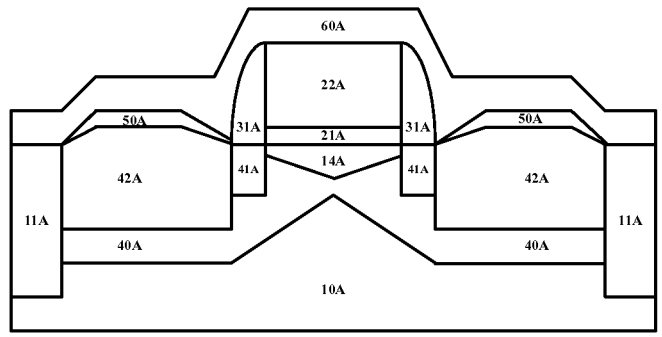
Figure 5B:
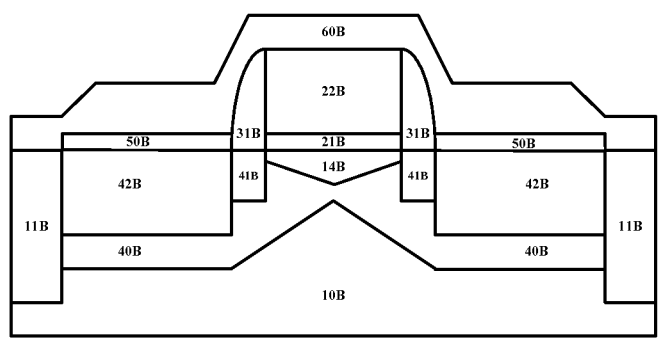

Next, with reference to FIGS. 5A and 5B, a silicide layer and a contact etch stop layer are formed on the source and drain regions. For the stressed layer 40 that contains silicon elements, a metal layer (not shown), for example, one of Ni, Pt, Co, Ti and Ge, or combinations thereof, can be directly formed on the source and drain regions 42 which are of the same material as the stressed layer 40 by such processes as evaporation, sputtering and MOCVD, then it is annealed at a high temperature of about 550-850° C. to form a metal silicide layer and the un-reacted metal layer is removed, thus a silicide layer 50A, 50B are left on the source and drain regions 42, which are made of, for example, one of $CoSi_2$, $TiSi_2$, NiSi, PtSi, NiPtSi, CoGeSi, TiGeSi and NiGeSi, so as to reduce the source/drain contact resistance. Subsequently, a contact etch stop layer (CESL) 60 made of, for example, silicon nitride or DLC, is formed on the entire device by such processes as PECVD, HDPCVD and ALD to apply stress to the channel region while protecting the underlayer device structure of the MOSFET.

Figure 6A:
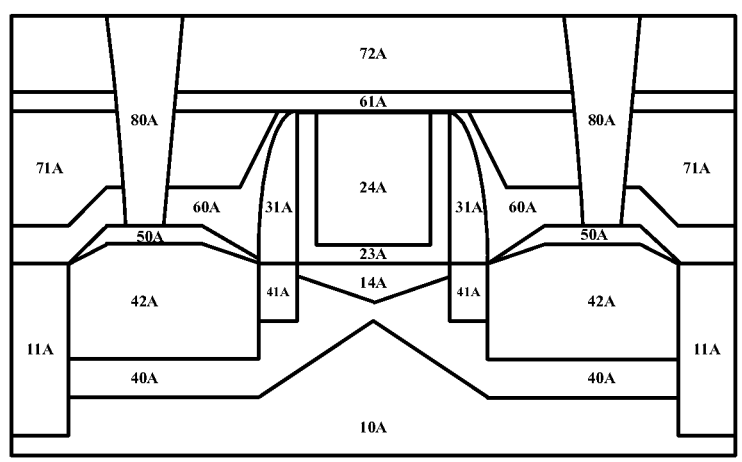
Figure 6B:
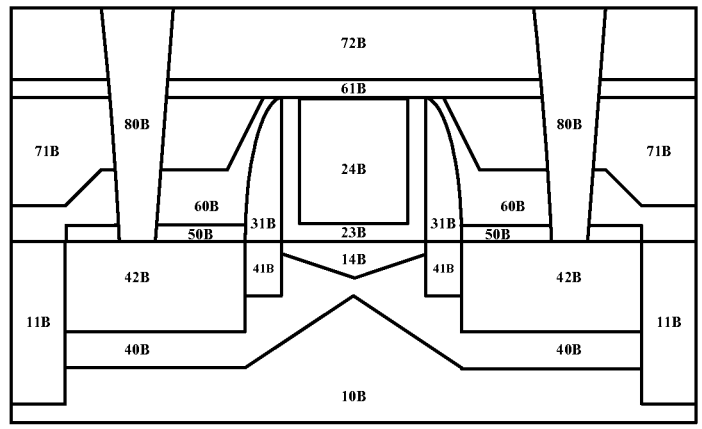

Finally, with reference to FIGS. 6A and 6B, the subsequent processes are completed to manufacture the final MOSFET device structure. A first interlayer dielectric (ILD) 71 is deposited on the entire device, which is made of, for example, a low-k dielectric.

With respect to the gate-first process (not shown in the figures), after planarizing the ILD 71 by CMP until the gate stack structure 20 is exposed, the ILD 71 is etched to expose the silicide layer 50 on the source and drain regions 42, and a contact metal is deposited to form source/drain metal plugs.

With respect to the gate-last process, after planarizing the ILD 71, the dummy gate material layer 22 as well as the gate insulating layer 21 that acts as the pad oxide layer are removed by wet etching and/or plasma etching, and the gate groove left is filled with a gate insulating layer 23 made of a high-k material and a gate conductive layer 24 made of a metal material, and preferably, a barrier layer made of metal nitride is inserted therebetween to adjust the work function while preventing diffusion of the metal into the gate insulating layer. Afterwards, a second CESL 61 and a second ILD 72 are deposited again and are planarized by CMP. The ILD 72, the CESL 61 and the ILD 71 are etched sequentially to form contact holes exposing the silicide 50, and the holes are filled with a metal to form source/drain contact plugs 80.

The finally formed device structure is as shown in FIGS. 6A and 6B, which includes a substrate 10, a gate stack structure 20 on the substrate 10, a channel region 14 in the substrate 10 under the gate stack structure 20, and a stressed layer 40 located under and at both sides of the channel region 14 in the substrate 10, wherein source and drain regions 42 (as well as the source and drain extension regions 41) are formed in the stressed layer 40. The stressed layer 40 has a Σ-shaped or inverse trapezoidal cross-section. A metal silicide layer 50 is formed on top of the source and drain regions 42. As for the rest of the structures and materials, they have been described in the method steps and will not be elaborated any more.

In another embodiment, in the step of forming the silicide 50 as shown in FIGS. 5A and 5B, if the stressed layer 40 does not contain silicon elements, then a silicon-containing cap layer 43A/43B, for example, one of Si, SiGe, Si:C and Si:H, or combinations thereof, is preferably formed on the stressed layer 40 by deposition. Subsequently, a metal layer is deposited and annealed to form a metal silicide 50. The steps afterwards are the same as those in embodiment 1.

Figure 7A:
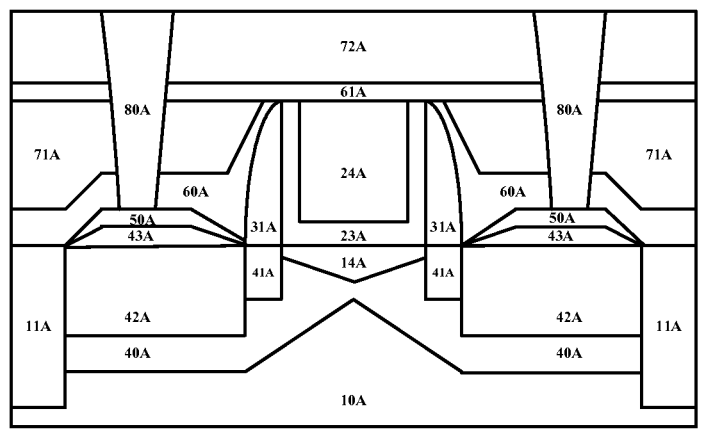
FIG. 7 is a sectional view of the MOSFET according to another embodiment of the present invention.
Figure 7B:
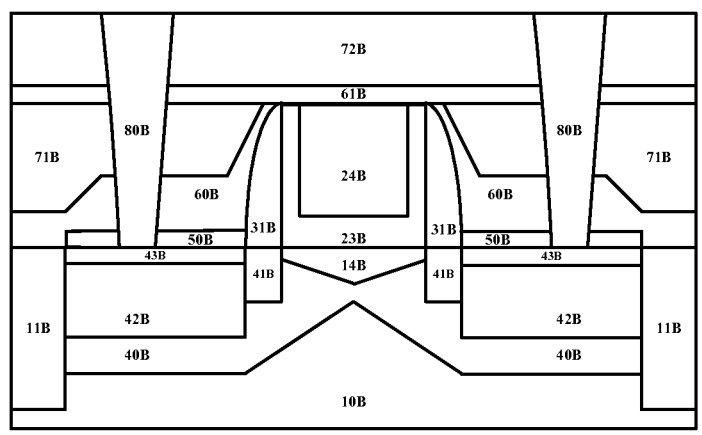

Therefore, in embodiment 2, the finally formed device structure is as shown in FIGS. 7A and 7B, and likewise, it comprises a substrate 10, a gate stack structure 20 on the substrate 10, a channel region 14 in the substrate 10 under the gate stack structure 20, and a stressed layer 40 located under and at both sides of the channel region in the substrate 10, wherein the source and drain regions 42 (as well as the source and drain extension regions 41) are formed in the stressed layer 40. The stressed layer 40 has a Σ-shaped or inverse trapezoidal cross-section. A silicon-containing cap layer 43 is formed on top of the source and drain regions 42, and a metal silicide layer 50 is formed on the top of the cap layer 43. As for the rest of the structures and materials, they have been described in the method steps and will not be elaborated any more.

In addition, although the drawings of the present invention are only the schematic drawings of the MOS having a planar channel, those skilled in the art shall be aware that the MOS structure of the present invention can also be applied to other device structures such as a 3D multi-gate structure, a vertical channel structure and a nanometer wire structure.

Furthermore, although the device structure and the method for manufacturing the same shown in the drawings are adapted to the gate-last process, those skilled in the art shall be aware that different stressed layer structures of the present invention are also adapted to the gate-first process.

According to the semiconductor device and the method for manufacturing the same of the present invention, a stressed layer is formed at both sides of and under the channel region made of a silicon-based material so as to act on the channel region, thus effectively increasing the carrier mobility of the channel region and improving the device performance.

Although the invention has been described in conjunction with one or more exemplary embodiments, those skilled in the art can understand that various appropriate changes and equivalents can be made to the device structure without departing from the scope of the invention. In addition, many modifications that might be adapted to specific situations or materials can be made from the disclosed teaching without departing from the scope of the invention. Therefore, the present invention is not intended to limit the invention to the specific embodiments disclosed as the preferred modes of implementing the invention, but the disclosed device structure and the method for manufacturing the same will include all embodiments that fall into the scope of the present invention.

What is claimed is:

1. A method for manufacturing a semiconductor device, comprising forming a gate stack structure on a substrate;
   etching the substrate at both sides of the gate stack structure to form source/drain grooves, wherein a channel region is formed in a part of the substrate between the source/drain grooves and the gate stack structure;
   epitaxially growing a stressed layer in the source/drain grooves, wherein the stressed layer is located under and at both sides of the channel region;
   forming source and drain regions in the stressed layer, and performing an in-situ doping to the upper part of the stressed layer to form the source and drain regions at the same time when epitaxially growing the stressed layer.

2. The method for manufacturing a semiconductor device according to claim 1, wherein the source/drain grooves have pentagonal shaped or inverse trapezoidal cross-sections, wherein width of middle of the grooves is greater than width of top and/or bottom of the grooves.

3. The method for manufacturing a semiconductor device according to claim 2, wherein forming the source/drain grooves further includes: etching the substrate to form first grooves whose top and bottom are of the same width; and etching sidewalls of the first grooves to form second grooves.

4. The method for manufacturing a semiconductor device according to claim 3, wherein the second grooves are communicated each other.

5. The method for manufacturing a semiconductor device according to claim 1, wherein doped ions are implanted into the stressed layer to form the source and drain regions.

6. The method for manufacturing a semiconductor device according to claim 1, wherein after forming the source and drain regions, a silicide layer is formed on top of the source and drain regions.

7. The method for manufacturing a semiconductor device according to claim 1, wherein after forming the source and drain regions, a silicon-containing cap layer is formed on top of the source and drain regions, and then a silicide layer is formed on the silicon-containing cap layer.

8. The method for manufacturing a semiconductor device according to claim 1, wherein for a PMOS, the material of the stressed layer includes one of SiGe, SiSn and GeSn, or combinations thereof; and for a NMOS, the material of the stressed layer includes one of Si:C, Si:H and SiGe:C, or combinations thereof.

* * * * *